United States Patent [19]

Schreck et al.

[11] Patent Number: 5,120,999
[45] Date of Patent: Jun. 9, 1992

[54] OUTPUT-BUFFER NOISE-CONTROL CIRCUIT

[75] Inventors: John F. Schreck; Dennis R. Robinson, both of Houston, Tex.

[73] Assignee: Texas Instruments Incorporated, Dallas, Tex.

[21] Appl. No.: 652,755

[22] Filed: Feb. 8, 1991

[51] Int. Cl.$^5$ ............... H03K 17/16; H03K 19/094
[52] U.S. Cl. ................................. 307/443; 307/451
[58] Field of Search ............. 307/443, 445, 448, 451; 365/189.05, 189.08, 189.09, 189.11, 190

[56] References Cited

U.S. PATENT DOCUMENTS 4,972,100  11/1990  Lim et al. ..................... 307/451 X

Primary Examiner—Steven Mottola
Attorney, Agent, or Firm—Theodore D. Lindgren; Richard L. Donaldson; Lawrence J. Bassuk

[57] ABSTRACT

Resistors are used as controlling devices to control the rate at which output buffer transistors are turned OFF and ON to control transient noise. In one form the output buffer circuit comprises a NOR circuit having a first input coupled to a data input and a second input to an enable input, a NAND circuit having a first input coupled to the data input and a second input coupled to an enable input, a first inverter transistor pair having gates coupled to the output of the NOR circuit and having source-drain paths in series coupled to a reference, a second inverter transistor pair having gates coupled to the output of the NAND circuit and having source-drain paths coupled in series to a supply, a resistor coupled between in series between the source-drain paths of the first transistor pair and the supply, a resistor coupled in series between the second transistor pair and the reference, and a third inverter transistor pair with each gate of the third transistor pair coupled to one of the outputs of the first and second inverter transistor pairs and with the output of the third transistor pair coupled to the output of the buffer circuit.

14 Claims, 8 Drawing Sheets

ADDRESS INPUT

| PRE DECODER | | | | | | | |
|---|---|---|---|---|---|---|---|
| PROGRAM PATH | | | | | | | |
| REDUNDANT ROWS | WORDLINE DECODER AND DRIVERS | R E D U N D A N T | REDUNDANT ROWS | REDUNDANT ROWS | WORDLINE DECODER AND DRIVERS | REDUNDANT ROWS | |
| 512x512 MEMORY CELL ARRAY | | C O L U M N S | 512x512 MEMORY CELL ARRAY | 512x512 MEMORY CELL ARRAY | | 512x512 MEMORY CELL ARRAY | |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES | |
| 512x512 MEMORY CELL ARRAY | WORDLINE DECODER AND DRIVERS | R E D U N D A N T | 512x512 MEMORY CELL ARRAY | 512x512 MEMORY CELL ARRAY | WORDLINE DECODER AND DRIVERS | 512x512 MEMORY CELL ARRAY | |
| 512x512 MEMORY CELL ARRAY | | C O L U M N S | 512x512 MEMORY CELL ARRAY | 512x512 MEMORY CELL ARRAY | | 512x512 MEMORY CELL ARRAY | |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES | |
| 512x512 MEMORY CELL ARRAY | WORDLINE DECODER AND DRIVERS | R E D U N D A N T | 512x512 MEMORY CELL ARRAY | 512x512 MEMORY CELL ARRAY | WORDLINE DECODER AND DRIVERS | 512x512 MEMORY CELL ARRAY | |
| VIRTUAL GROUND DECODER | COLUMN DECODER | C O L U M N S | VIRTUAL GROUND DECODER | VIRTUAL GROUND DECODER | COLUMN DECODER | VIRTUAL GROUND DECODER | |
| SENSE AMPS | | | SENSE AMPS | SENSE AMPS | | SENSE AMPS | |

DATA INPUT/OUTPUT

FIG. 1

OUTPUT-BUFFER NOISE-CONTROL CIRCUIT

BACKGROUND OF THE INVENTION

This invention relates to reduction of transient noise in the output signal of the output buffer of digital integrated circuits. In particular, this invention relates to an improved output buffer circuit for an integrated circuit, including resistors for damping the transient noise in the output buffer circuits.

An EPROM array is one example of an integrated circuit in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen row-line select voltage is applied to the control gate. The nonconductive state is read as a "zero" bit. The floating gate of a non-programmed cell is neutrally charged such that the source-drain path under the non-programmed floating gate is conductive when the same chosen row-line select voltage is applied to the control gate. The conductive state is read as a "one" bit. The output state of a cell is read by a sense amplifier, which transmits the data to a microprocessor by way of an output buffer circuit.

Certain prior-art output buffer circuits have had relatively large negative transient voltages (transient noise) during signal transitions, the transient voltages resulting from sudden decreases in current in the transistors of those output buffer circuits.

There is a need for reduction in the transient noise of digital-integrated-circuit output buffers, particularly during transitions of the input signals.

SUMMARY OF THE INVENTION

The circuitry of this invention reduces the transient noise in the output buffer of a digital integrated circuit. The reduction of transient noise results in a signal that is less likely to be misread by the microprocessor or other device connected to the output pin of the digital integrated circuit. The transient noise results from instant current change during shut-off of the output-buffer transistors.

The solution uses the fact that, when the speed at which the gates of the final stage are turned OFF or ON is controlled, the noise level is also controlled. Resistors are used as the controlling devices. One of the advantages of the solution is that resistor parameter characteristics are less susceptible to changes in voltages and temperatures.

In one form, the output buffer circuit comprises a NOR circuit having a first input coupled to a data input and a second input to an enable input, a NAND circuit having a first input coupled to the data input and a second input coupled to an enable input, a first inverter transistor pair having gates coupled to the output of the NOR circuit and having source-drain paths in series coupled to a reference, a second inverter transistor pair having gates coupled to the output of the NAND circuit and having source-drain paths coupled in series to a supply, a resistor coupled between in series between the source-drain paths of the first transistor pair and the supply, a resistor coupled in series between the second transistor pair and the reference, and a third inverter transistor pair with each gate of the third transistor pair coupled to one of the outputs of the first and second inverter transistor pairs and with the output of the third transistor pair coupled to the output of the buffer circuit.

BRIEF DESCRIPTION OF THE DRAWINGS

In the drawings:

FIG. 1 is a representation of an integrated circuit layout for a four-megabit EPROM array;

DETAILED DESCRIPTION OF THE SPECIFIC EMBODIMENT

Referring to FIG. 1, an example of an integrated circuit layout for a nominal four-megabit EPROM is illustrated. The layout, in which dimensional proportions are not those of actual manufacture, illustrates sixteen 512×512 memory sub-arrays with redundant rows and columns used to replace rows and columns having defective cells. Peripheral circuitry, including wordline decoders, column decoders, virtual-ground decoders, wordline drivers, and column/segment pass gates, all of which function to connecting reading and programming voltages to the rows and columns of cells in response to address inputs routed through a pre-decoder and program path. Data are written into the memory arrays during programming operations. During reading operations, data from the memory arrays are routed through sense amplifiers to the output.

Figure 2:
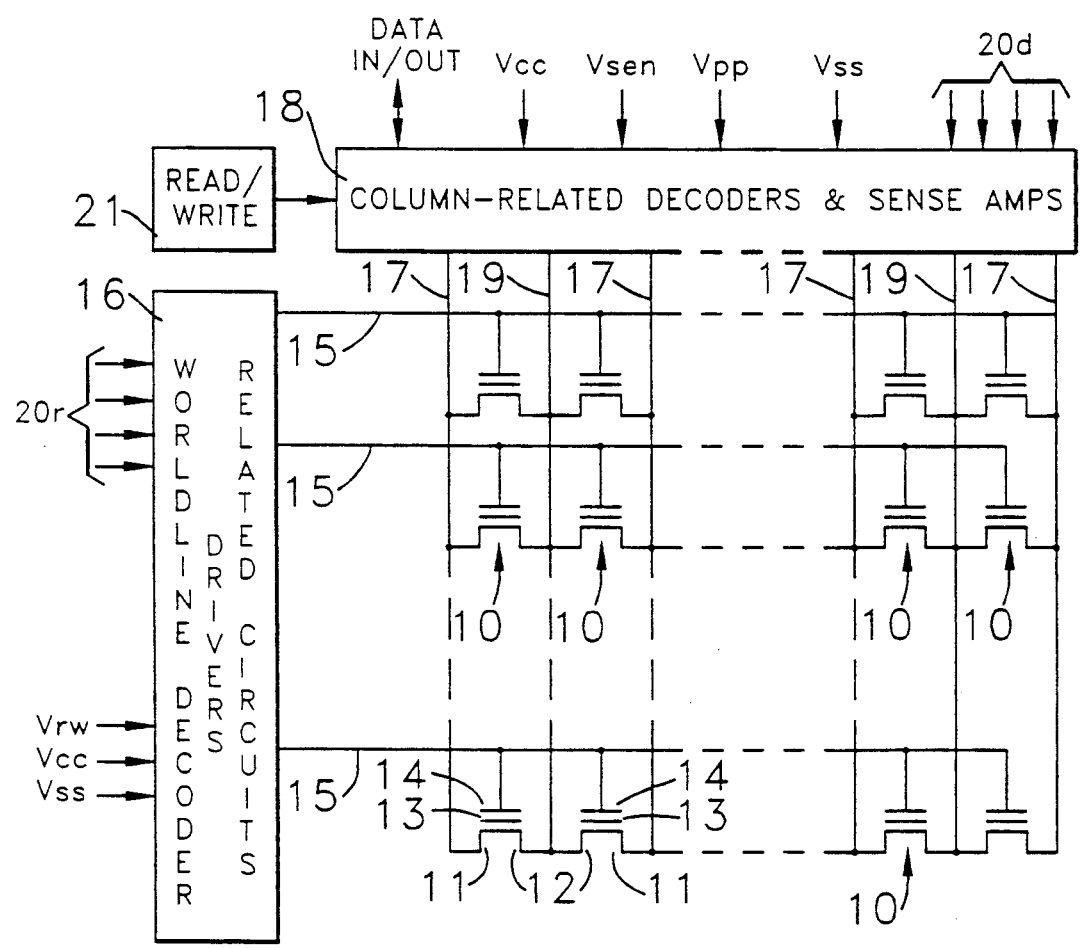
FIG. 2 is a representation of a part of a memory cell array and associated circuitry of the integrated circuit of FIG. 1.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15 (or row line 15), and each of the wordlines 15 is connected to a wordline circuit 16, which includes wordline decoders, drivers and related circuitry. Each of the sources 11 in a column of cells 10 is connected to a source-column line 17 (which may be a virtual-ground line), and each of the source-column lines 17 is connected to a column circuit 18, which includes column-/segment decoders, virtual ground decoders and column/segment pass gates. Each of the drains 12 in a column of cells 10 is connected to a drain-column line 19, and each of the drain-column lines 19 is connected to the column circuit 18.

In a write or program mode, the wordline circuit 16 may function, in response to wordline address signals on lines 20r and to signals from Read/Write control circuit 21, (or a microprocessor 21) to place a preselected first programming voltage Vpp (approx. +12.5V) on a selected wordline 15, including a selected control-gate conductor 14. Column circuit 18 also functions to place a second programming voltage Vrw (Vpp reduced through an impedance to approx. +5 to +10V) on a selected source-column line 17 and, therefore, the source 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately $-2V$ to $-6V$ with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx. +3 to +5V) to the selected wordline 15 (and the selected control gate 14), and to apply a low voltage (ground or Vss) to deselected wordlines 15. The column circuit 18 functions, in response to column address signals on lines 20d, causes a sense amplifier to apply a preselected positive voltage Vsen (approx. +1 to +1.5V) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal.

As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable.

The example digital intergrated circuit described above requires an output buffer circuit with reduced transient noise and with improved data transmission capability.

Figure 3A:
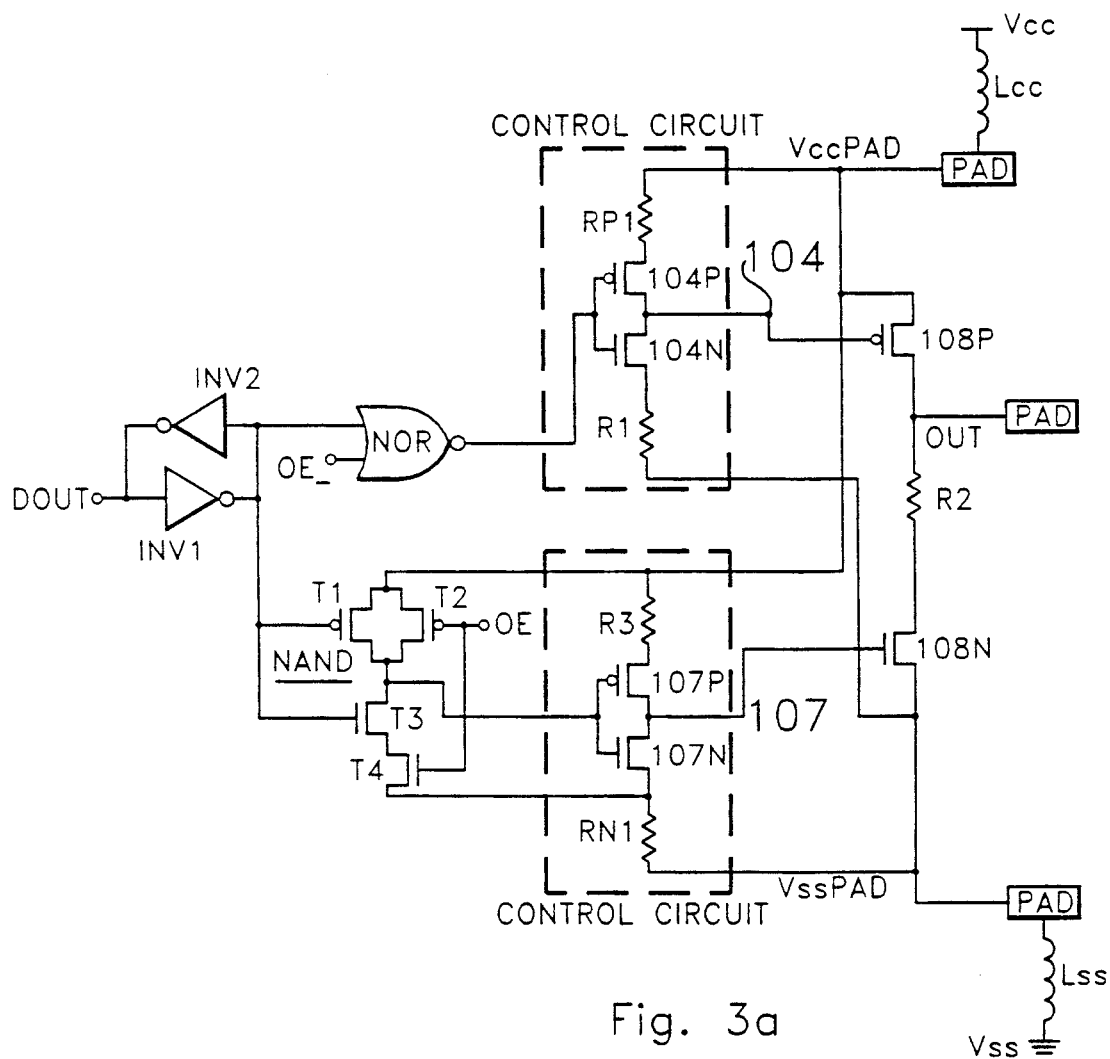
FIG. 3a is a schematic representation of the output buffer circuit of this patent disclosure.
Figure 3B:
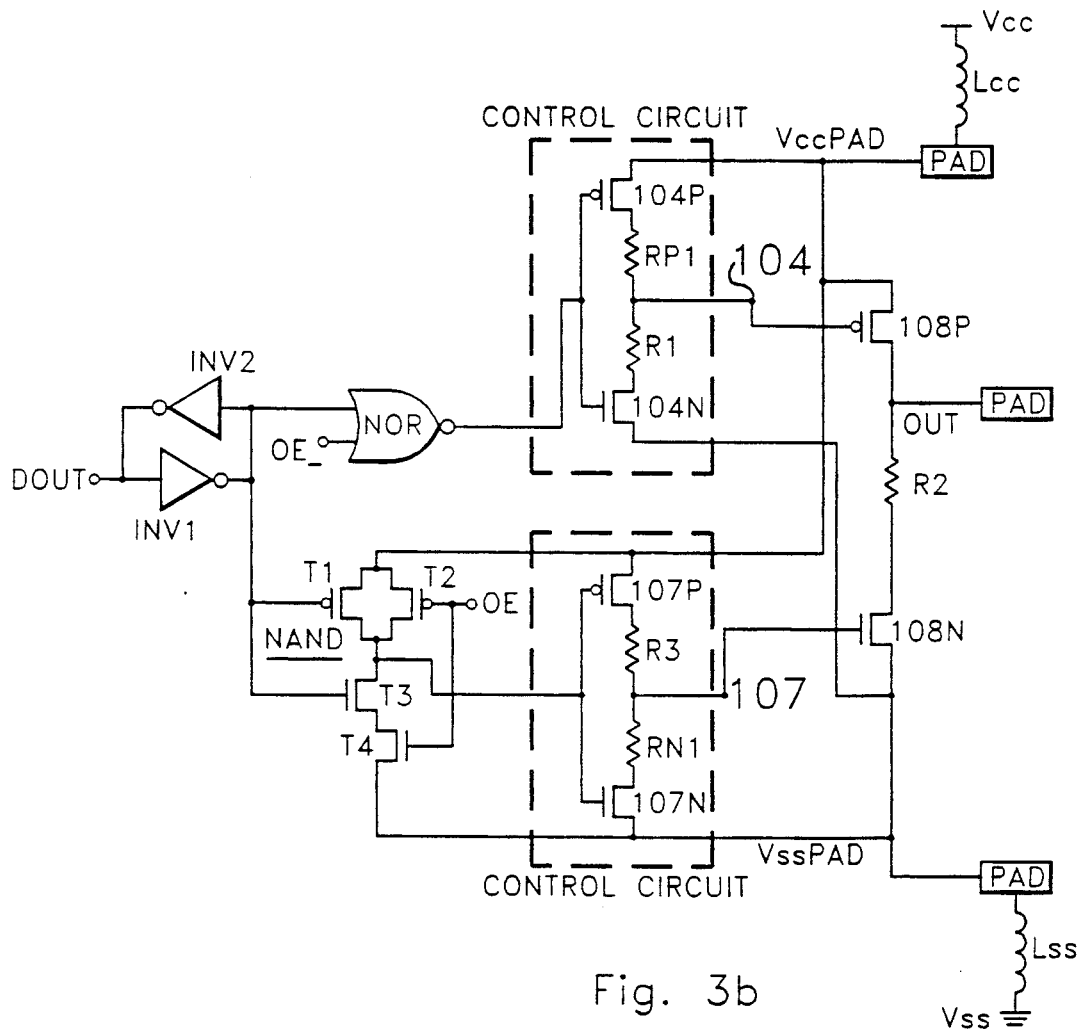
FIG. 3b is a second schematic representation of the output buffer circuit of this patent disclosure.
Figure 3C:
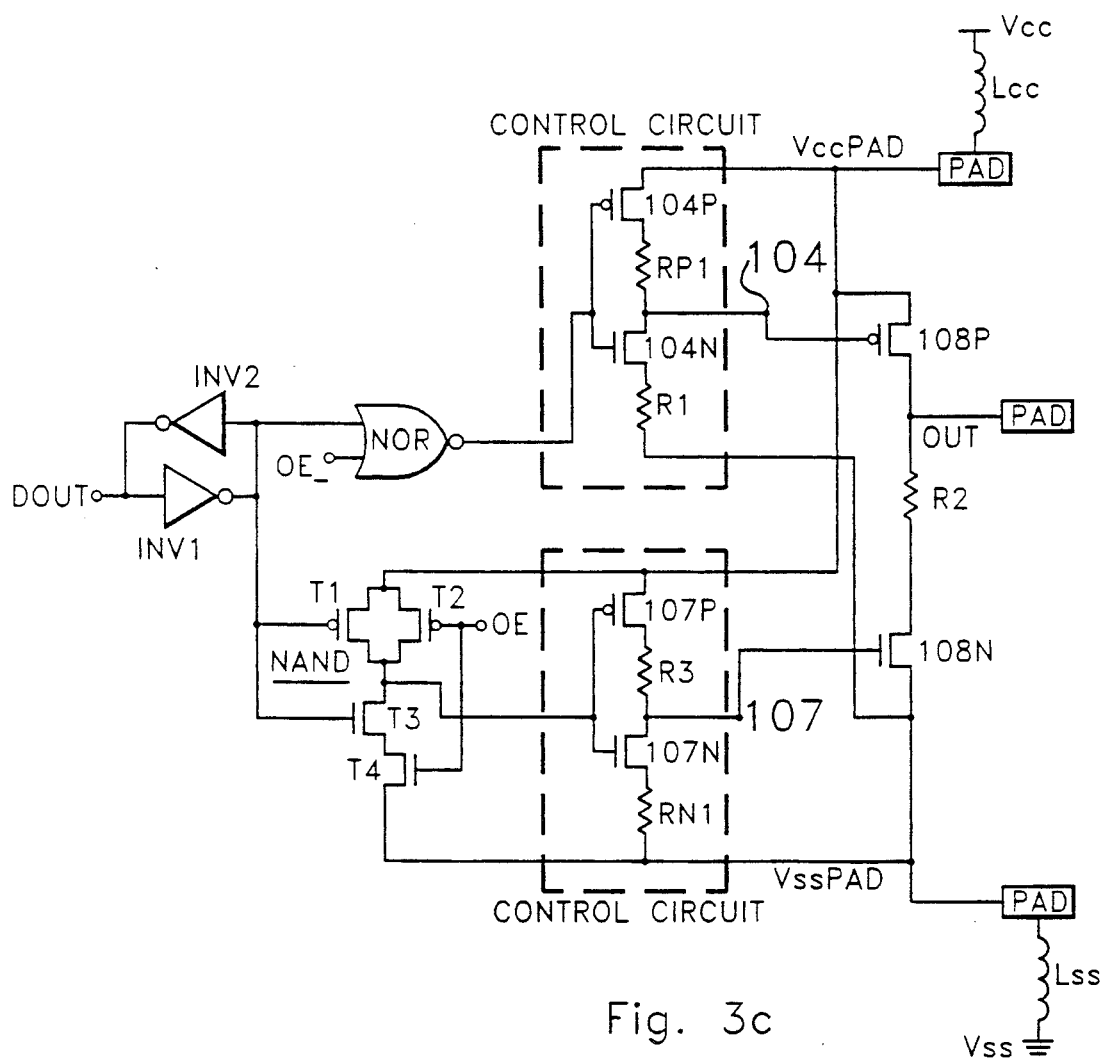
FIG. 3c is a third schematic representation of the output buffer circuit of this patent disclosure.
Figure 3D:
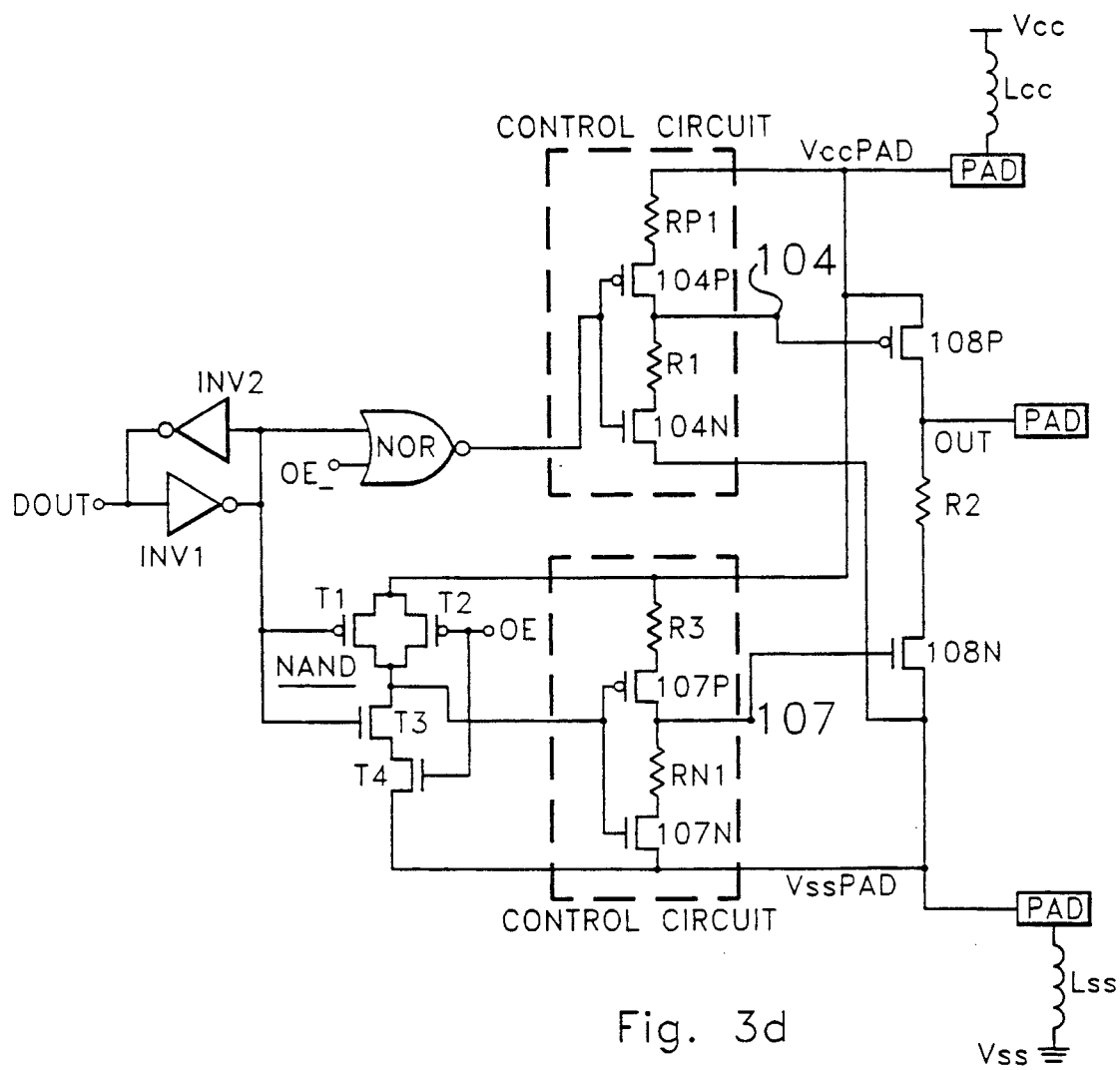
FIG. 3d is a fourth schematic representation of the output buffer circuit of this patent disclosure.

Referring now to FIG. 3a, an example output buffer circuit is shown for the purpose of illustrating the features of this invention. Inverters INV1 and INV2 comprise a standard hysteresis loop for driving the data output signal DOUT from a sense amplifier to either supply voltage Vcc level or chip reference potential VssPAD level. The output of the INV1, INV2 hysteresis loop is transmitted to one input of a NOR circuit and to one input of a NAND circuit comprising transistors T1-4. The other input of the NAND circuit is connected to an output enable signal OE and the other input of the NOR circuit is connected to an output enable signal $OE_{13}$, which is the inverse of output enable signal OE. The output of the NOR circuit is connected to the gates of inverter transistor pair 104P,104N. Resistor RP1, which may be formed by a P-type diffusion to be perhaps 2500 ohms, is connected between supply voltage Vcc and the source-drain paths of inverter transistor pair 104P,104N. Resistor R1, perhaps 3300 ohms, is connected between ship reference potential VssPAD and the source-drain paths of inverter transistor pair 104P, 104N. The output of the NAND circuit is connected to the gates of inverter transistor pair 107P,107N. Resistor R3, perhaps 5500 ohms, is connected between supply voltage Vcc and the source-drain paths of inverter transistor pair 107P,107N. Resistor RN1, which may be formed by N-type diffusion to be perhaps 2200 ohms, is connected between chip reference potential VssPAD and the source-drain paths of inverter transistor pair 107P,107N. The output 104 of inverter transistor pair 104P,104N is connected to the gate of P-channel transistor 108P. If the resistance of RP1 is much greater than the resistance of transistor 104P, then the switching time constant is approximated by the value of resistance RP1 times the gate capacitance of transistor 108P. The source-drain path of P-channel transistor 108P is connected between supply voltage Vcc and the output OUT of the example buffer circuit. The output 107 of inverter transistor pair 107P,107N is connected to the gate of N-channel transistor 108N. If the resistance of RN1 is much greater than the resistance of transistor 107N, then the switching time constant is approximated by the value of resistance RN1 times the gate capacitance of transistor 108N. The source-drain path of transistor 108N is connected between chip reference potential VssPAD and resistor R2. Resistor R2, perhaps 40 ohms, is connected in series with the source-drain path of transistor 108N to the output OUT of the buffer circuit.

Transient noise reduction is accomplished in the circuit of FIG. 3a by resistors RP1 and RN1 of the CONTROL CIRCUITs. The output of one CONTROL CIRCUIT is coupled to the gate of output buffer transistor 108N. That CONTROL CIRCUIT comprises a first P-conductivity-type transistor 107P, a second N-conductivity-type transistor 107N, a resistor RN1. The gate of transistor 107P is coupled to the input that CONTROL CIRCUIT and the source-drain path transistor 107P is coupled in series with resistor R3 between a supply VccPAD and the gate of buffer transistor 108N. The gate of transistor 107N is also coupled to the input of that CONTROL CIRCUIT and the source-drain path of transistor 107N is coupled the gate of buffer transistor 108N and resistor RN1. Resistor RN1 is coupled in series with the source-drain path of second transistor 107N to reference VssPAD.

The output of the other CONTROL CIRCUIT is coupled to the gate of output buffer transistor 108P. That CONTROL CIRCUIT comprises a first P-conductivity-type transistor 104P, a second N-conductivity-type transistor 104N and a resistor RP1. Resistor RP1 is coupled to supply VccPAD. The gate of transistor 104P is coupled to the input of that CONTROL CIRCUIT and the source-drain path transistor 104P is coupled in series with resistor RP1 to the gate of buffer transistor 108P. The gate of transistor 104N is coupled to the input of that CONTROL CIRCUIT and the source-drain path of transistor 104N is coupled in series with resistor R1 between the gate of buffer transistor 108P and reference VssPAD.

Without the two resistors RP1 and RN1, transient noise results from a change in current during a change in input signal level in one direction. The change in current in the VssPAD connection is generated by the sudden turn-off of the N-channel transistor 107N. The N-channel transistor 107N starts turning ON after output enable signal OE is switched high and a "zero" is at the input (DOUT). The addition of resistor RP1 to the circuit controls the noise at the supply voltage terminal Vcc in the same manner.

Resistors R1 and R3 decrease the surge in current in the other direction.

Figure 4:
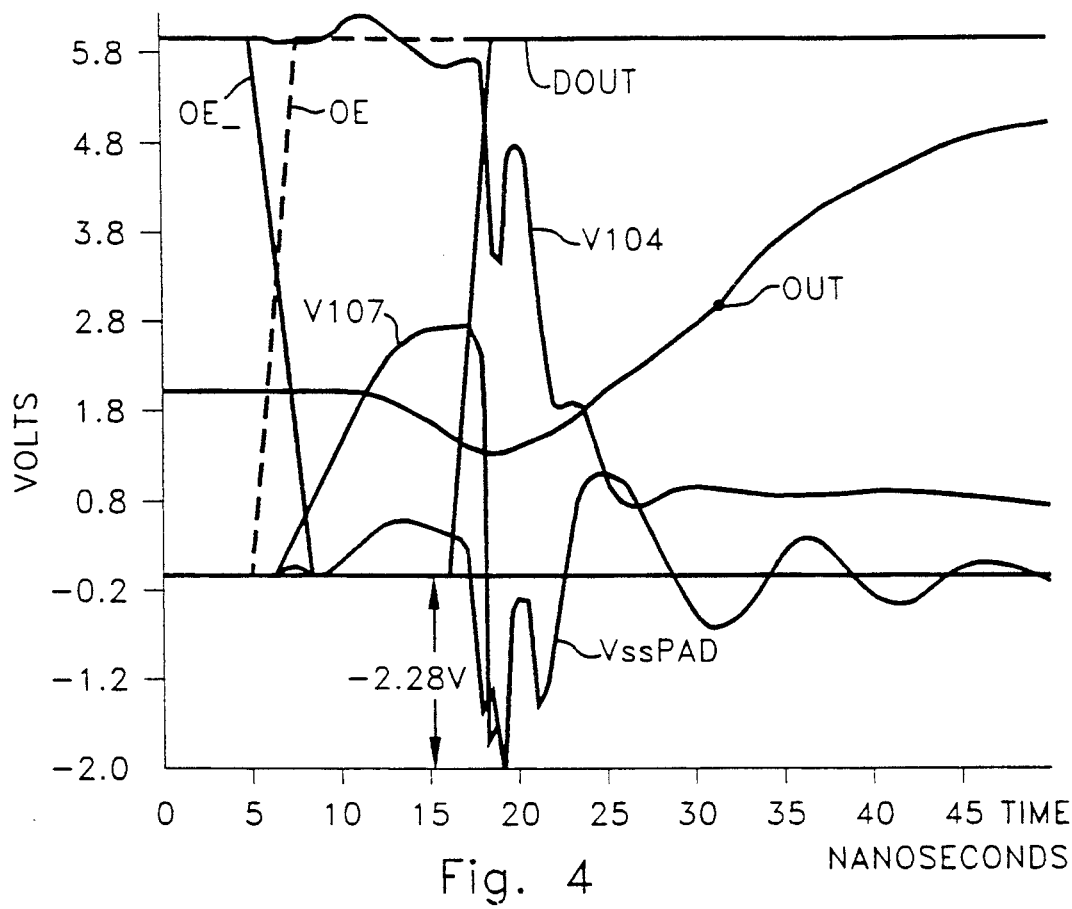
FIG. 4 is a representation of several of the voltage signals at various points in a prior-art output buffer circuit.

Referring now to FIG. 4, computer-simulated operation of the circuit without resistors RP1 and RN1 is illustrated. The chip enable change is simulated by switching DOUT high, causing the output to go from a floating state to a "one". The voltage at node 107, which controls the gate of transistor 108N, starts going high but is suddenly shut off by the chip enable signal change (simulated by switching DOUT high). This signal change is transmitted to the output signal OUT. The output signal OUT starts to go low before going high. When the signal on the gate of the transistor 108N causes transistor 108N to shut OFF, transistor 104P is turned ON, causing the output signal OUT to go high. Node 107 goes low, causing a sudden voltage drop and that voltage drop generates a change in current. The change in voltage is caused by the well known Lss di/dt inductive effect, where Lss is the inductance of the conductor between the chip reference potential pad and the common reference potential Vss connection between integrated circuit chips. (In addition to inductance of packaging connectors and circuit board conductors, the inductance Lss may also include series inductance of conductors formed on the substrate of the chip.) The change in current in this case is on the order of 128 milliamperes over a very short period of time. This sudden current change in current has an inverse reaction on the chip reference potential VssPAD at the output of the circuit, causing it to go negative with respect to the common reference potential Vss. This negative "bump" (shown as −2.28V) on the VssPAD will be transmitted to any device connected to the PAD transmitting the OUT signal and may cause the connected device to latch-up. Internally, the negative "bump" degrades the specified low-voltage trip level. A similar bump occurs at the VccPAD supply because of the inductance Lcc of the connection between that PAD and supply voltage Vcc. (In addition to packaging connectors and circuit board conductors, the inductance Lcc may also include any series inductance of conductors formed on the substrate of the chip.)

Figure 5:
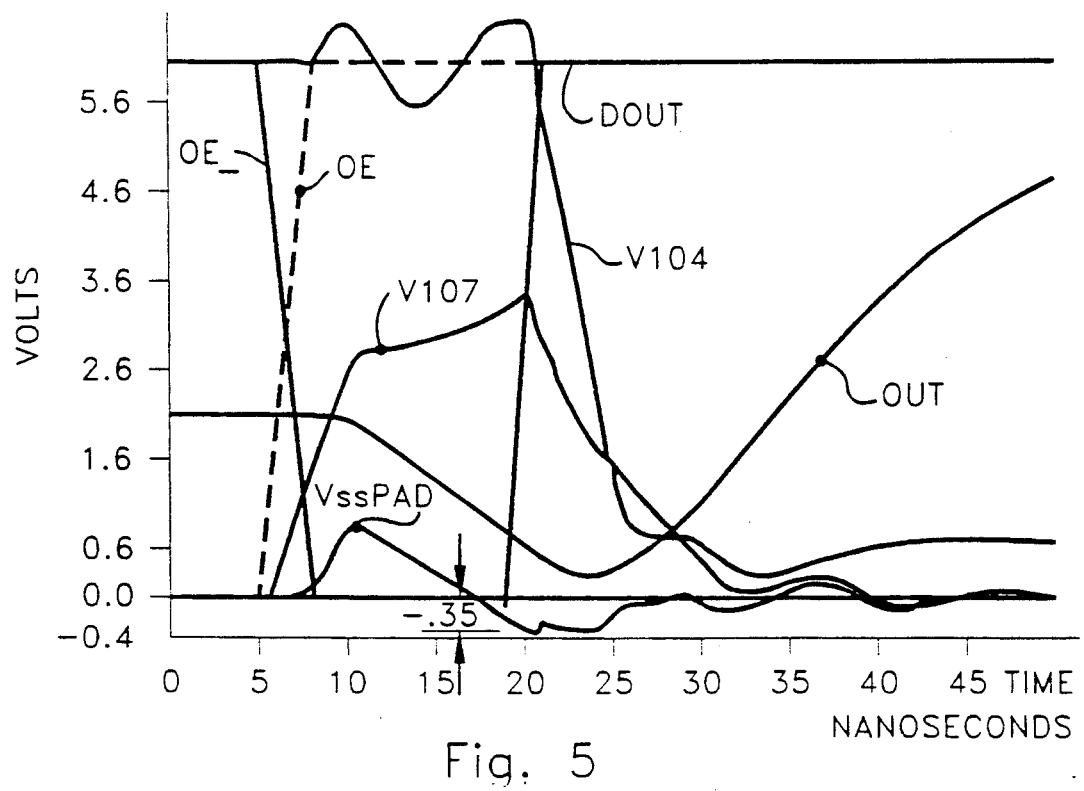
FIG. 5 is a representation of voltage signals corresponding to the signals of FIG. 4 in the output buffer circuit of this invention.

Referring now to FIG. 5, computer-simulated operation of the circuit with resistors RP1 and RN1 is illustrated. The addition of resistor RN1 controls the turn-off rate of transistor 108N, thereby decreasing the noise at the output buffer VssPAD terminal. Resistor RN1 slows the turn-off of transistor 108N. The slower speed at which the transistor 108N is turned off decreases the rate of change of current. This reduces the VssPAD "bump" to −0.35V in the illustrated example. The addition of resistor RN1 has slowed the rate of change of digital signal applied to gates of transistors 107P and 107N. A similar discussion pertains to the addition of resistor RP1.

As shown by comparison of FIGS. 4 and 5, the addition of resistors RP1 and RN1 reduces the noise "bump" from −2.28V to −.35V. Because resistors RP1 and RN1 are not temperature or voltage sensitive, the noise "bump" is reduced for all temperature and voltage ranges of operation.

Figure 3E:
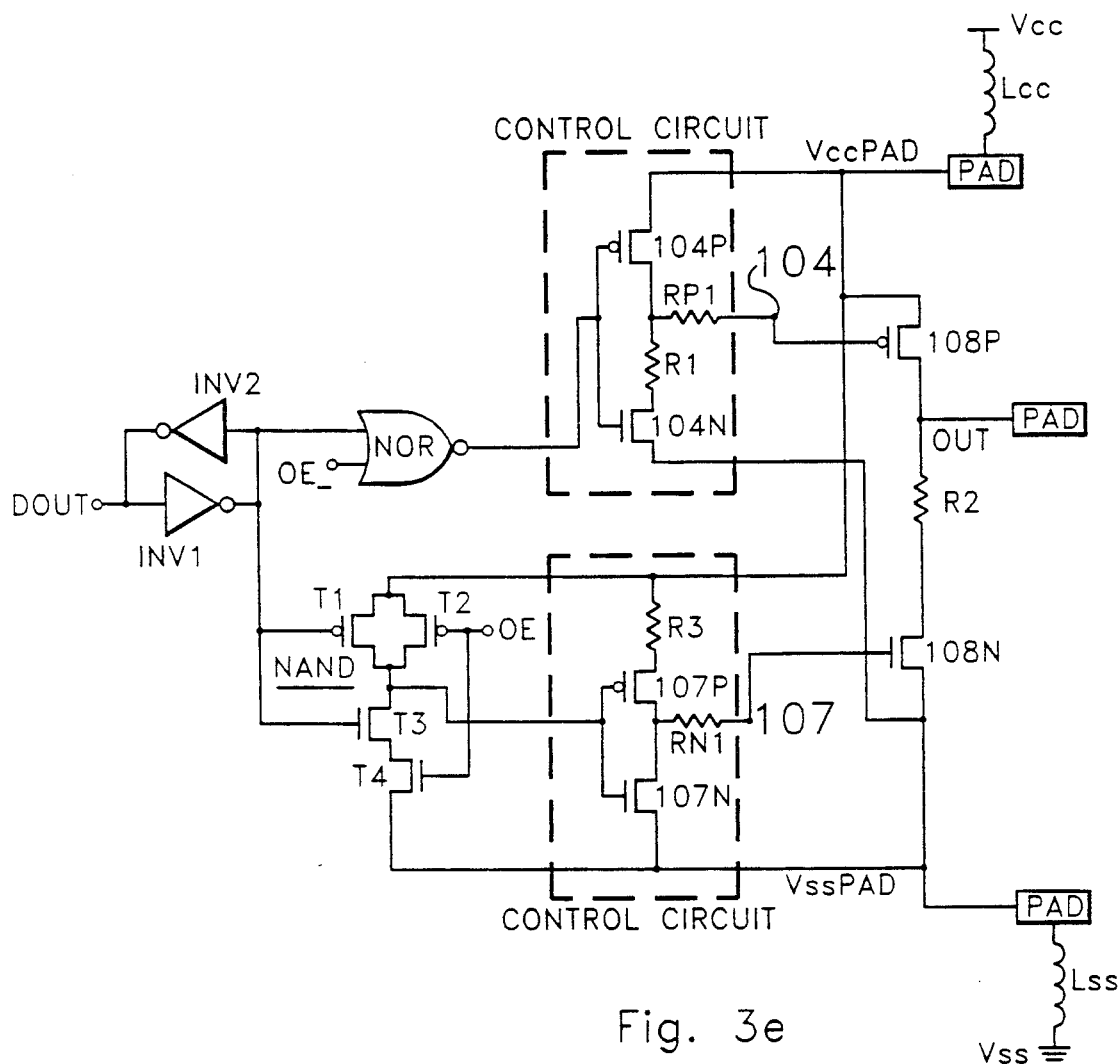
FIG. 3e is a fifth schematic representation of the output buffer circuit of this patent disclosure.

FIGS. 3b–e illustrate alternative locations of RP1 and RN1 in the CONTROL CIRCUITs. During damping operation, the resistors RP1 and RN1 are in series with the source-drain paths of transistors 107P and 107N, respectively, in all of FIGS. 3b–e. In FIG. 3e, the value of resistor R3 is decreased by the value of resistor RN1 as compared to the value of resistor R3 in FIGS. 3a–d. Similarly in FIG. 3e, the value of resistor R1 is decreased by the value of resistor RP1 as compared to the value of resistor R1 in FIGS. 3a–d. Other configurations are obvious.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A control circuit for an output buffer transistor having a gate, said control circuit having an input, said control circuit comprising:
    a first transistor of a first conductivity-type, said first transistor having a gate and a source-drain path;
    a second transistor of a second conductivity-type, said second transistor having a gate and a source-drain path;
    a first resistor having first and second terminals; and
    a second resistor;
    said gate of said first transistor coupled to said input of said control circuit, said source-drain path of said first transistor coupled between a supply and said first terminal of said first resistor;
    said gate of said second transistor coupled to said input of said control circuit, said source-drain path of said second transistor coupled said first terminal of said first resistor and a reference;
    said second terminal of said first resistor coupled to said gate of said buffer transistor; and
    said second resistor connected in series with one of said source-drain paths of said first and second transistors.

2. The control circuit of claim 1, wherein said first conductivity-type is P-type.

3. The control circuit of claim 1, wherein said resistor is formed by a N-type diffusion.

4. A control circuit for an output buffer transistor having a gate, said control circuit having an input, said control circuit comprising:
    a first transistor of a first conductivity-type, said first transistor having a gate and a source-drain path;
    a second transistor of a second conductivity-type, said second transistor having a gate and a source-drain path;
    a first resistor having first and second terminals; and
    a second resistor;
    said gate of said first transistor coupled to said input of said control circuit, said source-drain path of said first transistor coupled between a voltage source and said first terminal of said first resistor;

said gate of said second transistor coupled to said input of said control circuit, said source-drain path of said second transistor coupled between said first terminal of said first resistor and a reference;

said second terminal of said first resistor coupled to said gate of said buffer transistor; and said second resistor connected in series with one of said source-drain paths of said first and second transistors.

5. The control circuit of claim 4, wherein said first conductivity-type is P-type 6. The control circuit of claim 4, wherein said resistor is formed by a P-type diffusion.

7. An output buffer circuit having at least one enable input, a data input, an output, a reference and a supply, comprising:

a NOR circuit having first and second inputs and an output, said first input of said NOR circuit coupled to said data input, and second input of said NOR circuit coupled to a said enable input;

a NAND circuit having first and second inputs and an output, said first input of said NAND circuit coupled to said data input, said second input of said NAND circuit coupled to a said enable input;

a first inverter transistor pair having gates and having an output between coupled source-drain paths, said gates of said first pair coupled to said output of said NOR circuit, said source-drain paths of said first pair coupled in series between said supply and said reference;

a second inverter transistor pair having gates and having an output between coupled source-drain paths, said gates of said second pair coupled to said output of said NAND circuit, said source-drain paths of said second pair coupled in series to said supply;

a resistor coupled in series between said source-drain paths of said second pair and said reference; and a third inverter transistor pair having gates and having an output between coupled source-drain paths, each said gate of said third inverter pair coupled to one of said outputs of said first and second inverter transistor pairs, said output of said third inverter transistor pair coupled to said output of said buffer circuit.

8. The output buffer circuit of claim 7, including a second resistor coupled in series between said supply and said source-drain paths of said first pair.

9. The output buffer circuit of claim 7, wherein said resistor is formed by a N-type diffusion.

10. The output buffer circuit of claim 7, wherein the product of said resistor and of a capacitance of a said gate of said third inverter pair approximate a said output buffer switching time constant.

11. An output buffer circuit having at least one enable input, a data input, an output, a reference and a supply, comprising:

a NOR circuit having first and second inputs and an output, said first input of said NOR circuit coupled to said data input, said second input of said NOR circuit coupled to a said enable input;

a NAND circuit having first and second inputs and an output, said first input of said NAND circuit coupled to said data input, said second input of said NAND circuit coupled to a said enable input;

a first inverter transistor pair having gates and having an output between coupled source-drain paths, said gates of said first pair coupled to said output of said NOR circuit, said source-drain paths of said first pair coupled in series to said reference;

a resistor coupled in series between said source-drain paths of said first pair and said supply;

a second inverter transistor pair having gates and having an output between coupled source-drain paths, said gates of said second pair coupled to said output of said NAND circuit, said source-drain paths of said second pair coupled in series between said supply and said reference; and a third inverter transistor pair having gates and having an output between coupled source-drain paths, each said gate of said third inverter pair coupled to one of said outputs of said first and second inverter transistor pairs, said output of said third inverter transistor pair coupled to said output of said buffer circuit.

12. The output buffer circuit of claim 11, including a second transistor coupled between said source-drain path of said second pair and said reference.

13. The output buffer circuit of claim 11, wherein said resistor is formed by a P-type diffusion.

14. The output buffer circuit of claim 11, wherein the product of said resistor and of a capacitance of a said gate or said third inverter pair approximate a said output buffer switching time constant.

* * * * *